United States Patent [19]

Noguchi

[11] Patent Number: 4,532,482
[45] Date of Patent: Jul. 30, 1985

[54] CIRCUIT FOR PREVENTING MALFUNCTION OF MUTING AMPLIFIER

[75] Inventor: Tadashi Noguchi, Tokyo, Japan

[73] Assignee: Pioneer Electronic Corporation, Tokyo, Japan

[21] Appl. No.: 494,396

[22] Filed: May 13, 1983

[30] Foreign Application Priority Data

May 17, 1982 [JP] Japan ................... 57-081659

[51] Int. Cl.³ .................................. H03F 3/14
[52] U.S. Cl. ........................ 330/307; 330/254; 455/194
[58] Field of Search ............ 330/252, 254, 307; 455/194

[56] References Cited

U.S. PATENT DOCUMENTS 4,140,960 2/1979 Ohsawa ................. 455/194 X

Primary Examiner—James B. Mullins
Assistant Examiner—Steven J. Mottola
Attorney, Agent, or Firm—Armstrong, Nikaido Marmelstein & Kubovcik

[57] ABSTRACT

A circuit for preventing malfunction of a muting amplifier is provided. The circuit of a muting amplifier is composed a semiconductor integrated circuit which comprises a first lateral p-n-p transistor to receive an input signal applied to the base thereof and one or more second lateral p-n-p transistors serving as a constant current source and performs an amplifying operation during the conduction of the second lateral p-n-p transistors or is placed in a muting mode during the cutoff thereof, the circuit configuration of this invention is such that a third p-n-p transistor is provided in the vicinity of the first lateral p-n-p transistor and is so connected as to turn on the second lateral p-n-p transistors during the conduction of the third p-n-p transistor, wherein, when the input signal level becomes lower than the minimum potential in the integrated circuit, the third transistor is turned on by an n-p-n transistor, which works as a parasitic transistor. Applying the current introduced by another parasitic p-n-p transistor in the direction reverse to the current caused by the foresaid parasitic n-p-n transistor can eliminate the disadvantage in the conventional circuit configuration.

3 Claims, 4 Drawing Figures

CIRCUIT FOR PREVENTING MALFUNCTION OF MUTING AMPLIFIER

BACKGROUND OF THE INVENTION

The present invention relates to a circuit configuration for preventing malfunction of a muting amplifier in a semiconductor integrated circuit.

In the conventional circuit, if the input signal is a non-steady state, there may occur an occasion where the potential at the positive input terminal 5 is rendered lower than $-V_{cc}$ by a differentiator including a capacitor C1 and a resistor R1. At such a time, the potential at the base 10 of the transistor Q5 comes to drop below $-V_{cc}$. And particularly when this potential decreases to be lower than $(-V_{cc}-V_{BE})$, it causes conduction of a parasitic n-p-n transistor 12 whose emitter, base and collector are the base 10 of the transistor Q5, the isolation region and the base 11 of the transistor Q1, respectively.

The same phenomenon happens also with respect to a transistor Q3 or Q4 as in the preceding case of the transistor Q1. And upon conduction of the parasitic transistor 12, a base current comes to flow in each of the transistors Q1, Q3 and Q4 to turn on the transistors Q3 and Q4 as a result, hence inducing a disadvantage that the amplifier function is performed despite the application of muting to eventually produce an unrequired output signal.

SUMMARY OF THE INVENTION

The present invention has been accomplished in view of the circumstances mentioned above, and its object resides in providing a novel circuit configuration capable of eliminating the aforesaid disadvantage to prevent the malfunction of a muting amplifier.

DETAILED DESCRIPTION OF THE INVENTION

Hereinafter the present invention will be described with reference to exemplary embodiments thereof.

Figure 1:
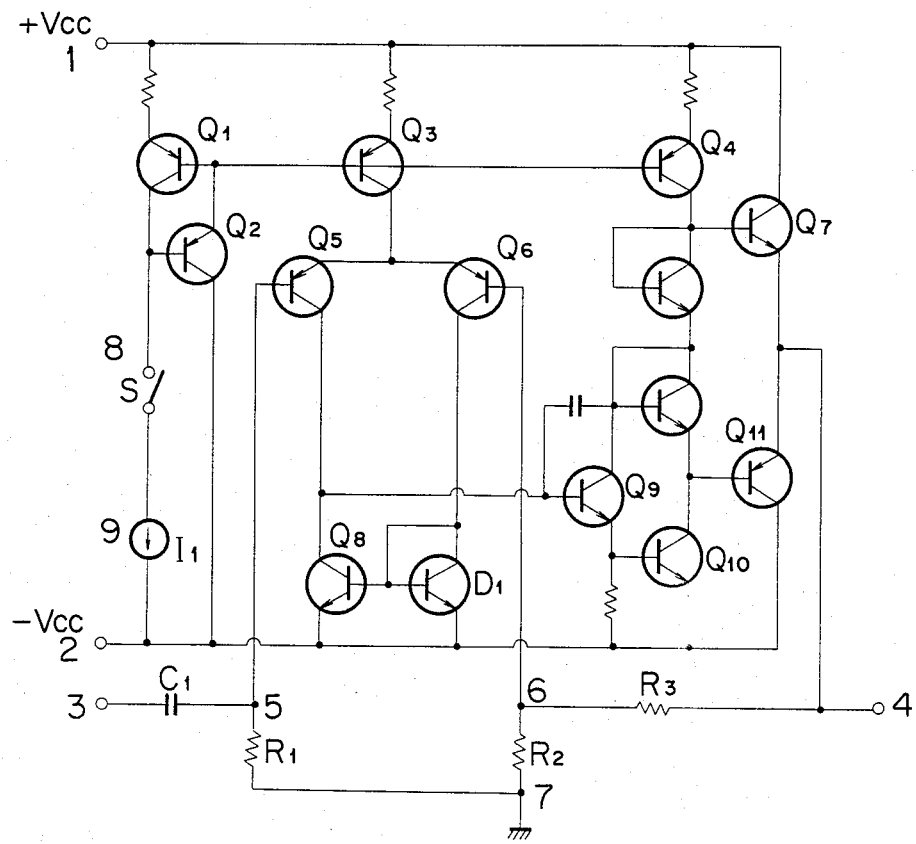
FIG. 1 is a circuit diagram of an exemplary muting amplifier to which the present invention is applied.

FIG. 1 is a circuit diagram showing an exemplary muting amplifier to which the present invention is applied, wherein there are shown a $+V_{cc}$ terminal 1 of a power supply, a $-V_{cc}$ terminal 2 of the power supply, a signal input terminal 3, a signal output terminal 4, a positive input terminal 5 of the amplifier, a negative input terminal 6 of the amplifier, a reference potential 7, a muting switch 8, and a constant current source 9 turned on and off by the switch 8.

A DC blocking capacitor C1 is connected between, the signal input terminal 3 and the positive input terminal 5, a bias resistor R1 between the reference potential 7 and the positive input terminal 5, a feedback resistor R2 between the reference potential 7 and the negative input terminal 6, and another feedback resistor R3 between the negative input terminal 6 and the signal output terminal 4, respectively.

The positive input terminal 5 is connected to the base of a lateral p-n-p transistor Q5 while the negative input terminal 6 is connected to the base of a lateral p-n-p transistor Q6. And a constant current source including a lateral transistor Q3 is joined to the emitters of two transistors Q5 and Q6 connected in common with each other, thereby constituting a differential amplifier. The output of this amplifier is produced from a current mirror circuit including a diode D1 and a transistor Q8, subsequently amplified by transistors Q9 and Q10, and then sent via transistors Q7 and Q11.

Supposing now that a muting switch S is at its on-position, the transistors Q1 through Q4 are turned on by the constant current source I1, so that the amplifier functions with a gain of $(R2+R3)/R2$.

Meanwhile, when the muting switch S is at its off-position, the entire diodes and transistors are turned off to disconnect the signal input terminal 3 from the signal output terminal 4, whereby muting is effected. In this condition, the signal output terminal 4 is maintained at a reference potential through the resistors R2 and R3.

In case the input signal is in a non-steady state at the time of switching on or off the power supply, the switch S is turned off so as to prohibit outputting the signal.

Figure 2:
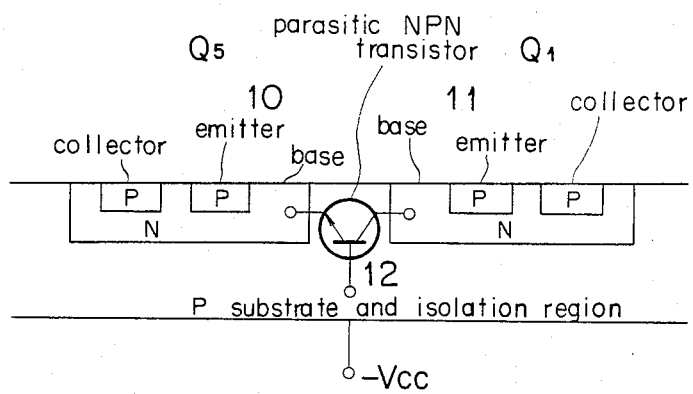
FIG. 2 is a sectional view of lateral p-n-p transistors Q5 and Q1 employed in the muting amplifier of FIG. 1.

FIG. 2 is a sectional view of the transistors Q5 and Q1. As illustrated, the base of each of the transistors Q1 and Q5 is an n-type region, while the isolation is a p-type region and is connected to the $-V_{cc}$ terminal.

Figure 3:
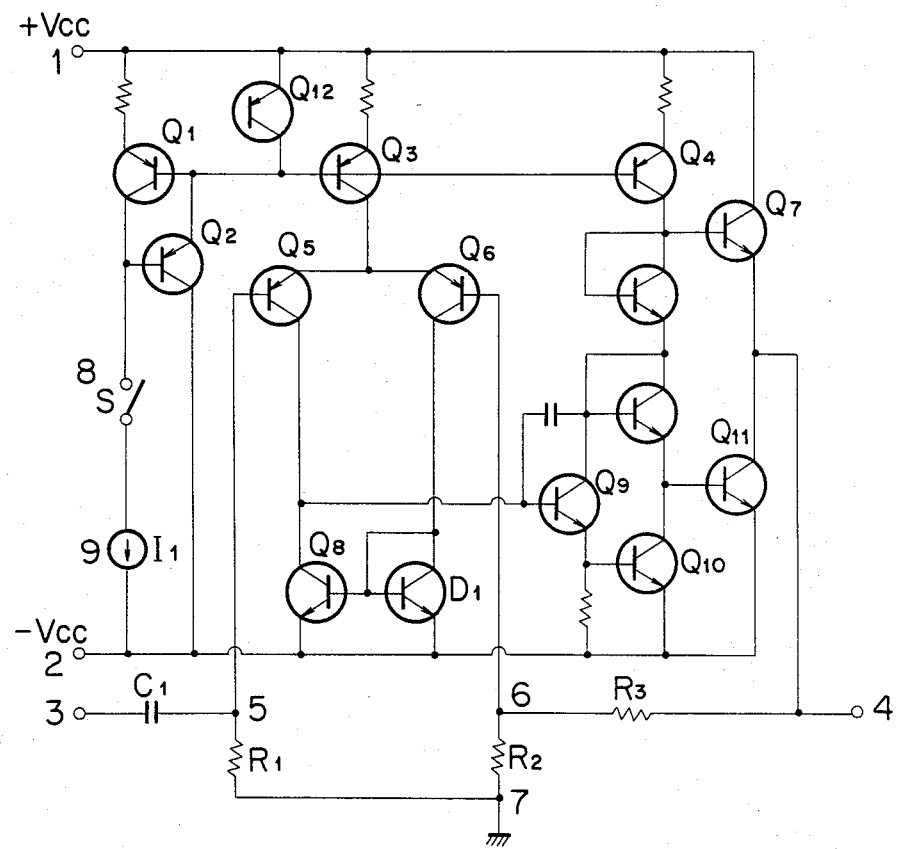
FIG. 3 is a circuit diagram of a muting amplifier equipped with a first embodiment of the present invention.

FIG. 3 is a circuit diagram of a first embodiment according to the invention.

This embodiment has such a configuration that the emitter of a lateral transistor Q12 is connected to the $+V_{cc}$ terminal of the power supply in the muting amplifier of FIG. 1, and the collector of the transistor Q12 is connected to the base of the transistor Q1, Q3 or Q4 while the base thereof is kept open.

When the voltage at the positive input terminal 5 becomes lower than $(-V_{cc}-V_{BE})$ during a muting mode with the muting switch S turned off in the above embodiment, the transistors Q1, Q3, Q4 and a parasitic n-p-n transistor 12 connected to the transistor Q5 are turned on individually. Meanwhile, another parasitic p-n-p transistor provided between the transistors Q12 and Q5 is also turned on in a similar manner. The current introduced by the parasitic p-n-p transistor to the base of the transistor Q12 is multiplied in accordance with its current amplification factor hfe and then is applied to the bases of the transistors Q1, Q3 and Q4 in the direction reverse to the current caused by the parasitic n-p-n transistor 12. Consequently, the transistors Q1, Q3 and Q4 are permitted to remain in the cutoff state respectively, hence eliminating the disadvantage in the conventional circuit configuration.

Another embodiment of this invention will now be described below.

Figure 4:
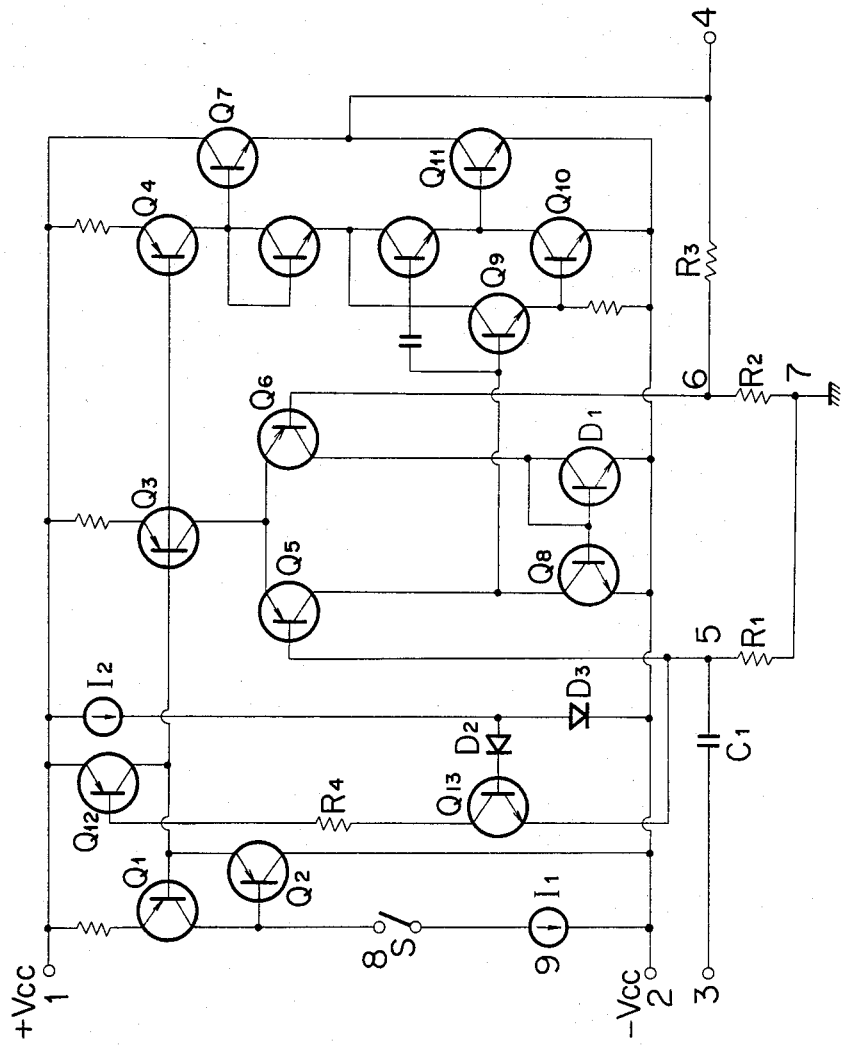
FIG. 4 is a circuit diagram of another muting amplifier equipped with a second embodiment of the invention.

FIG. 4 is a circuit diagram of a second embodiment according to the invention, wherein a transistor Q13 is connected between the base of the transistor Q12 and the positive input terminal 5 in the circuit of FIG. 3 in such a manner that a current from a constant current source I2 connected to the $+V_{cc}$ terminal of a positive power supply is introduced to the base of the transistor Q13 via a current limiting resistor R4 and a diode D2, and further the said current is fed to the $-V_{cc}$ terminal 2 of a negative power supply via a diode D3.

The diode D2 serves to prevent reverse breakdown between the base and emitter of the transistor Q13, and the diode D3 functions as a level shift circuit to correct the voltage $V_D$ of the diode D2.

In the second embodiment, the current for turning on the transistor Q12 is supplied via the transistor Q13 instead of the parasitic n-p-n transistor 12 employed in the first embodiment, and the action executed is the same in the two embodiments.

As described hereinabove, in a muting amplifier composed of a semiconductor integrated circuit which comprises a first lateral p-n-p transistor to receive an input signal applied to the base thereof and one or more second lateral p-n-p transistors serving as a constant current source and performs an amplifying operation during the conduction of the second lateral p-n-p transistors or is placed in a muting mode during the cutoff thereof, the circuit configuration of this invention is such that a third p-n-p transistor is provided in the vicinity of the first lateral p-n-p transistor and is so connected as to turn on the second lateral p-n-p transistors during the conduction of the third p-n-p transistor, wherein, when the input signal level becomes lower than the minimum potential in the integrated circuit, the third transistor is turned on by an n-p-n transistor, so that if any input voltage below $(-V_{cc}-V_{BE})$ is applied in a muting mode, it is possible to maintain the muting effect continuously.

And the circuit configuration for such operation can be formed into a simple arrangement.

What is claimed is:

1. A circuit for preventing malfunction of a muting amplifier composed of a semiconductor integrated circuit which comprises a first lateral p-n-p transistor to receive an input signal applied to the base thereof and at least one second lateral p-n-p transistor serving as a constant current source and performing an amplifying operation during the conduction of said second lateral p-n-p transistor or is placed in a muting mode during the cutoff thereof, said circuit characterized in that a third lateral p-n-p transistor is provided in the vicinity of said first lateral p-n-p transistor and is connected such that said second lateral p-n-p transistor is turned off during the conduction of said third lateral p-n-p transistor, and when the input signal level becomes lower than the minimum potential in the integrated circuit, said third lateral p-n-p transistor is turned on by an n-p-n transistor.

2. The circuit as defined in claim 1, wherein said n-p-n transistor is a parasitic one.

3. The circuit as defined in claim 1, wherein said second lateral p-n-p transistors are applied the current introduced by another parasitic p-n-p transistor to the bases thereof in the direction reverse to the current caused by the parasitic n-p-n transistor.

* * * * *